(12) United States Patent
Chen

(10) Patent No.: US 9,287,246 B2
(45) Date of Patent: Mar. 15, 2016

(54) PACKAGE ASSEMBLY AND METHODS FOR FORMING THE SAME

(71) Applicant: Taiwan Semiconductor Manufacturing Company, Ltd., Hsin-Chu (TW)

(72) Inventor: Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/560,859

(22) Filed: Dec. 4, 2014

(65) Prior Publication Data

US 2015/0084211 A1    Mar. 26, 2015

Related U.S. Application Data

(63) Continuation of application No. 13/570,049, filed on Aug. 8, 2012, now Pat. No. 8,987,884.

(51) Int. Cl.

| | |
|---|---|
| *H01L 25/10* | (2006.01) |
| *H01L 23/00* | (2006.01) |
| *H01L 23/498* | (2006.01) |
| *H01L 25/065* | (2006.01) |
| *H05K 1/02* | (2006.01) |

(Continued)

(52) U.S. Cl.
CPC ............ *H01L 25/105* (2013.01); *H01L 21/485* (2013.01); *H01L 23/49827* (2013.01); *H01L 23/49838* (2013.01); *H01L 23/49894* (2013.01); *H01L 23/5382* (2013.01); *H01L 23/5383* (2013.01); *H01L 24/09* (2013.01); *H01L 24/17* (2013.01); *H01L 24/81* (2013.01); *H01L 25/0655* (2013.01); *H05K 1/0295* (2013.01); *H01L 24/13* (2013.01); *H01L 24/16* (2013.01); *H01L 2224/0362* (2013.01); *H01L 2224/0401* (2013.01); *H01L 2224/04105* (2013.01); *H01L 2224/08225* (2013.01); *H01L 2224/09051* (2013.01); *H01L 2224/131* (2013.01); *H01L 2224/16225* (2013.01); *H01L 2224/16227* (2013.01); *H01L 2224/17051* (2013.01); *H01L 2224/17515* (2013.01); *H01L 2224/81192* (2013.01); *H01L 2224/81193* (2013.01); *H01L 2224/81395* (2013.01); *H01L 2224/81801* (2013.01); *H01L 2224/81895* (2013.01); *H01L 2924/15192* (2013.01); *H01L 2924/15311* (2013.01); *H01L 2924/19042* (2013.01); *H01L 2924/19105* (2013.01); *H05K 2201/09954* (2013.01); *H05K 2201/10674* (2013.01)

(58) Field of Classification Search
None
See application file for complete search history.

(56) References Cited

U.S. PATENT DOCUMENTS

| | | |
|---|---|---|
| 6,762,495 B1 | 7/2004 | Reyes et al. |
| 8,513,796 B2 | 8/2013 | Tseng et al. |

(Continued)

FOREIGN PATENT DOCUMENTS

TW    200947664    11/2009

*Primary Examiner* — Joseph Schoenholtz
(74) *Attorney, Agent, or Firm* — Slater & Matsil, L.L.P.

(57) ABSTRACT

A device includes a first package component, and a second package component underlying the first package component. The second package component includes a first electrical connector at a top surface of the second package component, wherein the first electrical connector is bonded to the first package component. The second package component further includes a second electrical connector at the top surface of the second package component, wherein no package component is overlying and bonded to the second electrical connector.

20 Claims, 10 Drawing Sheets

(51) Int. Cl.
  *H01L 21/48* (2006.01)
  *H01L 23/538* (2006.01)

(56) References Cited

U.S. PATENT DOCUMENTS

| | | | |
|---|---|---|---|
| 2003/0164540 A1* | 9/2003 | Lee et al. | 257/686 |
| 2004/0046255 A1 | 3/2004 | Hsu et al. | |
| 2006/0279000 A1 | 12/2006 | Chang et al. | |
| 2007/0238220 A1 | 10/2007 | Lii et al. | |
| 2007/0246811 A1 | 10/2007 | Tsai | |
| 2009/0151997 A1 | 6/2009 | Hsieh et al. | |
| 2009/0230541 A1 | 9/2009 | Araki et al. | |
| 2011/0089560 A1 | 4/2011 | Kuo et al. | |
| 2011/0215360 A1 | 9/2011 | Wang | |
| 2011/0285007 A1* | 11/2011 | Chi et al. | 257/686 |
| 2013/0168857 A1 | 7/2013 | Gregorich et al. | |
| 2013/0334685 A1* | 12/2013 | Kim et al. | 257/738 |

* cited by examiner

PACKAGE ASSEMBLY AND METHODS FOR FORMING THE SAME

PRIORITY CLAIM AND CROSS-REFERENCE

This application is a continuation of U.S. patent application Ser. No. 13/570,049, entitled "Package Assembly and Methods for Forming the Same," filed on Aug. 8, 2012, which application is incorporated herein by reference.

BACKGROUND

In a conventional packaging process, a device die is bonded to a bottom package component such as a package substrate or a Printed Circuit Board (PCB). The device die includes a plurality of connectors such as bond pads or copper bumps, which are used to bond to the connectors of the bottom package component.

The connectors of the device die are aligned to the connectors of the bottom package component. The electrical interconnection in the bottom package component is determined by the design of the device die. Accordingly, in the design and the manufacturing of the bottom package component, the electrical interconnection in the bottom package component is customized according to the design of the device die. When the design of the device die is changed, the bottom package component may also need to be redesigned.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of designing and packaging package components and the method of forming the same are provided in accordance with various exemplary embodiments. The intermediate stages of forming the packages are illustrated. The variations of the packaging process are discussed. Throughout the various views and illustrative embodiments, like reference numbers are used to designate like elements.

Figure 1:
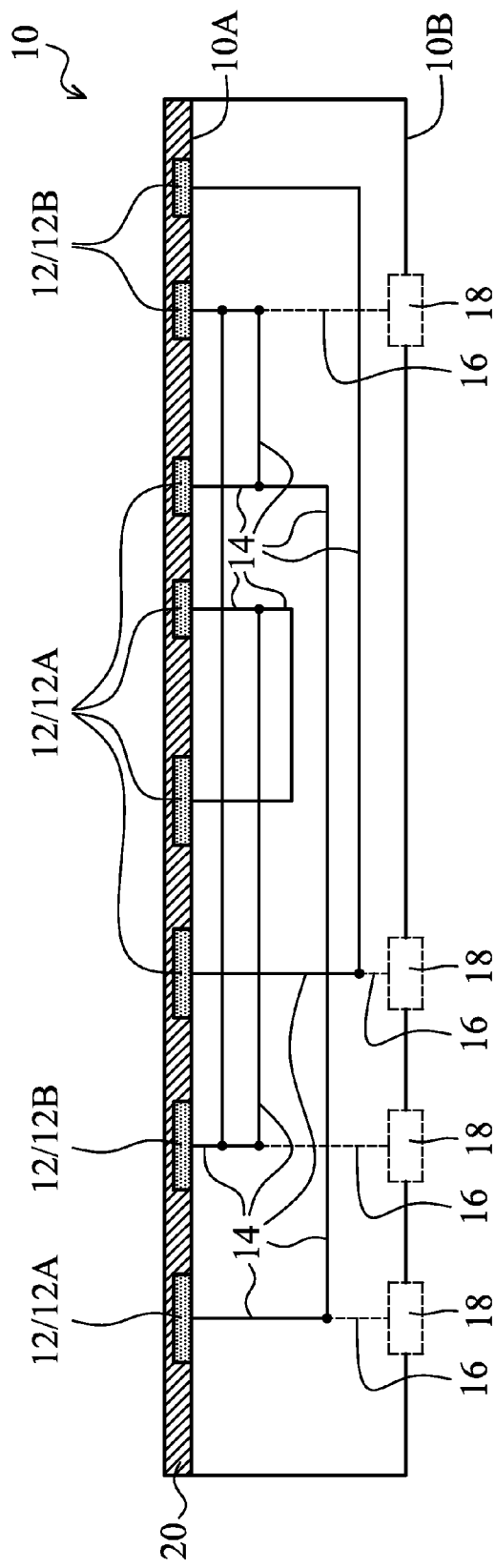
FIGS. 1 through 6 are cross-sectional views of intermediate stages in the manufacturing of a first-generation package in accordance with some exemplary embodiments.
Figure 2:
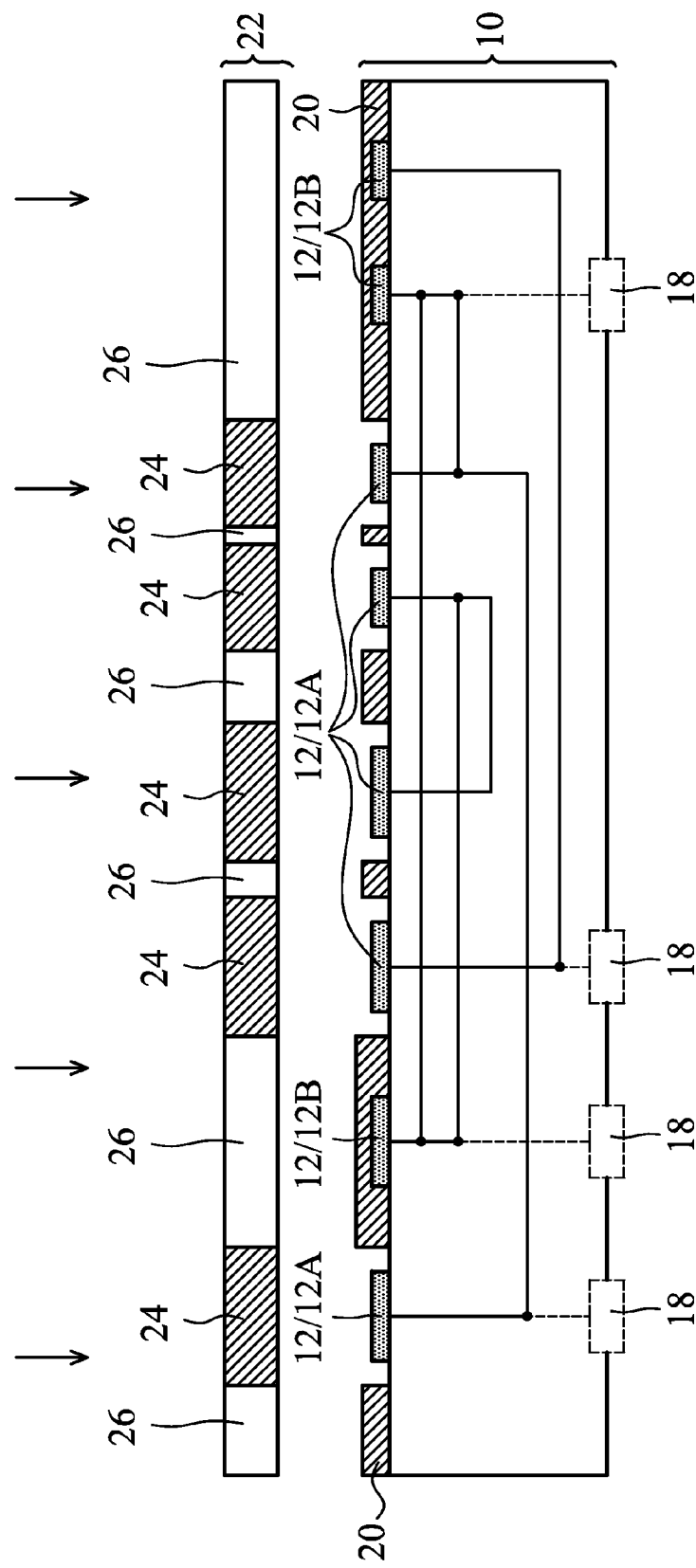
Figure 3:
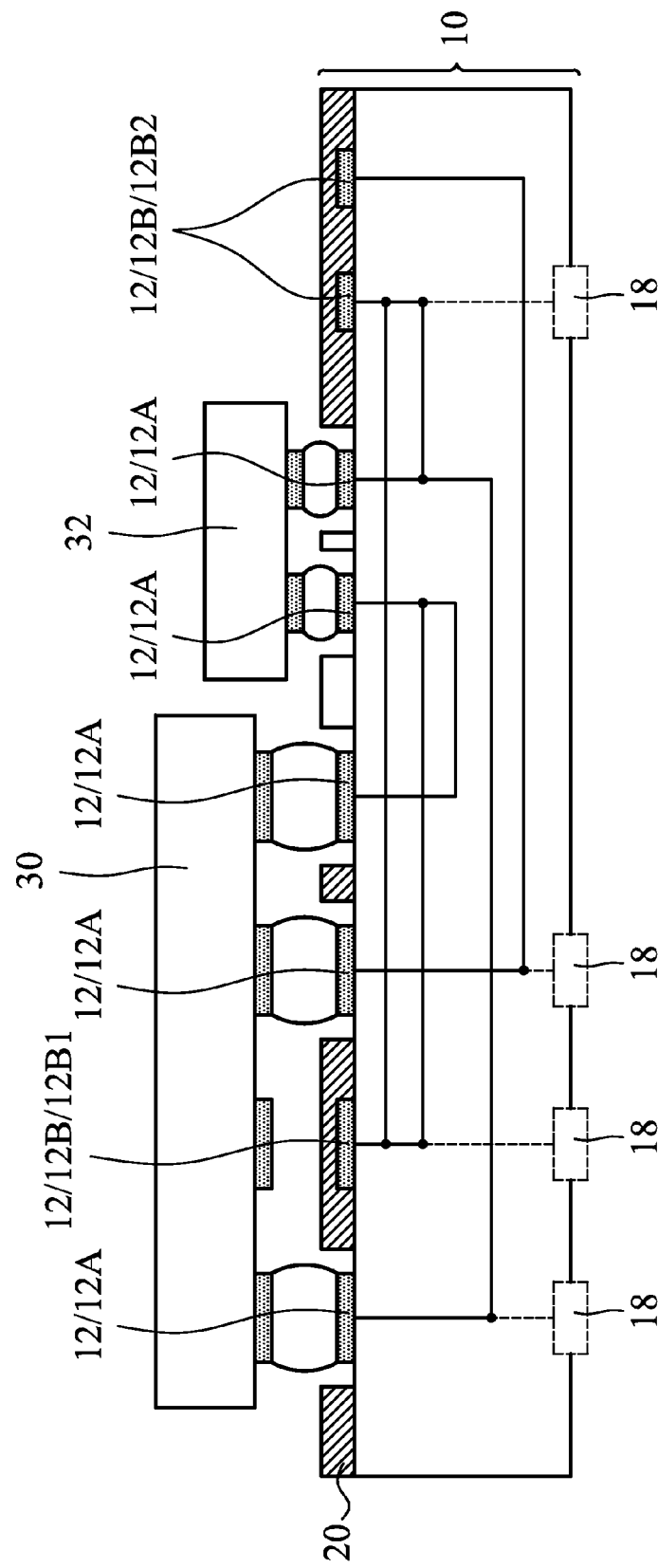
Figure 4:
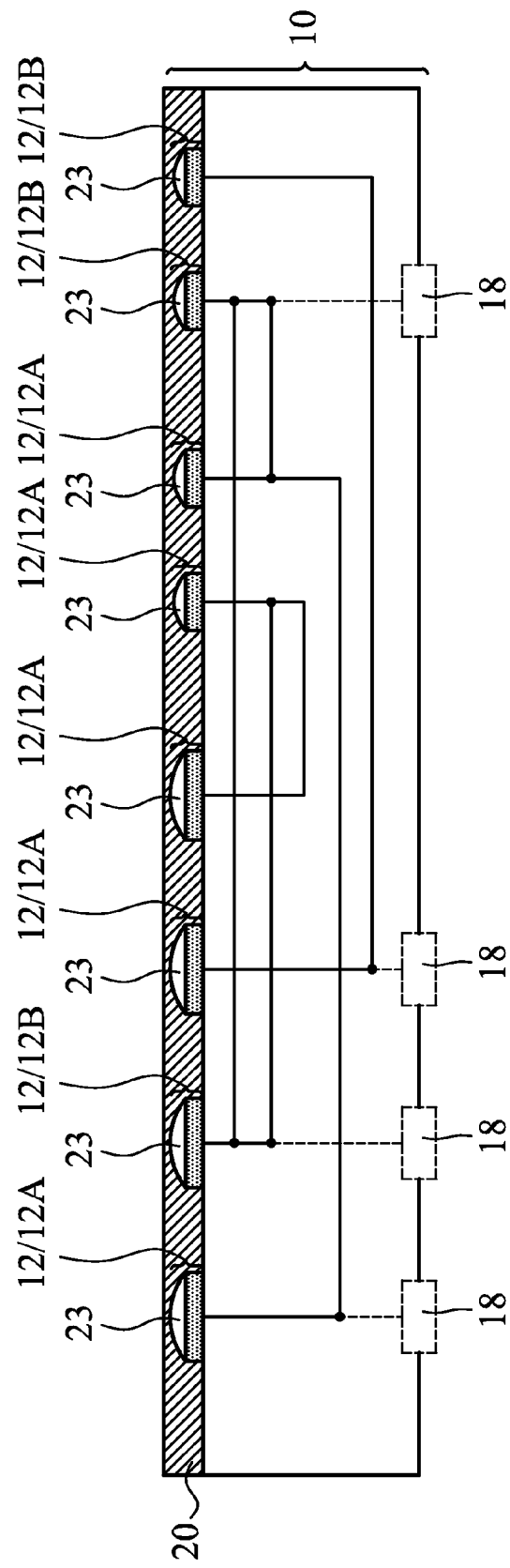
Figure 5:
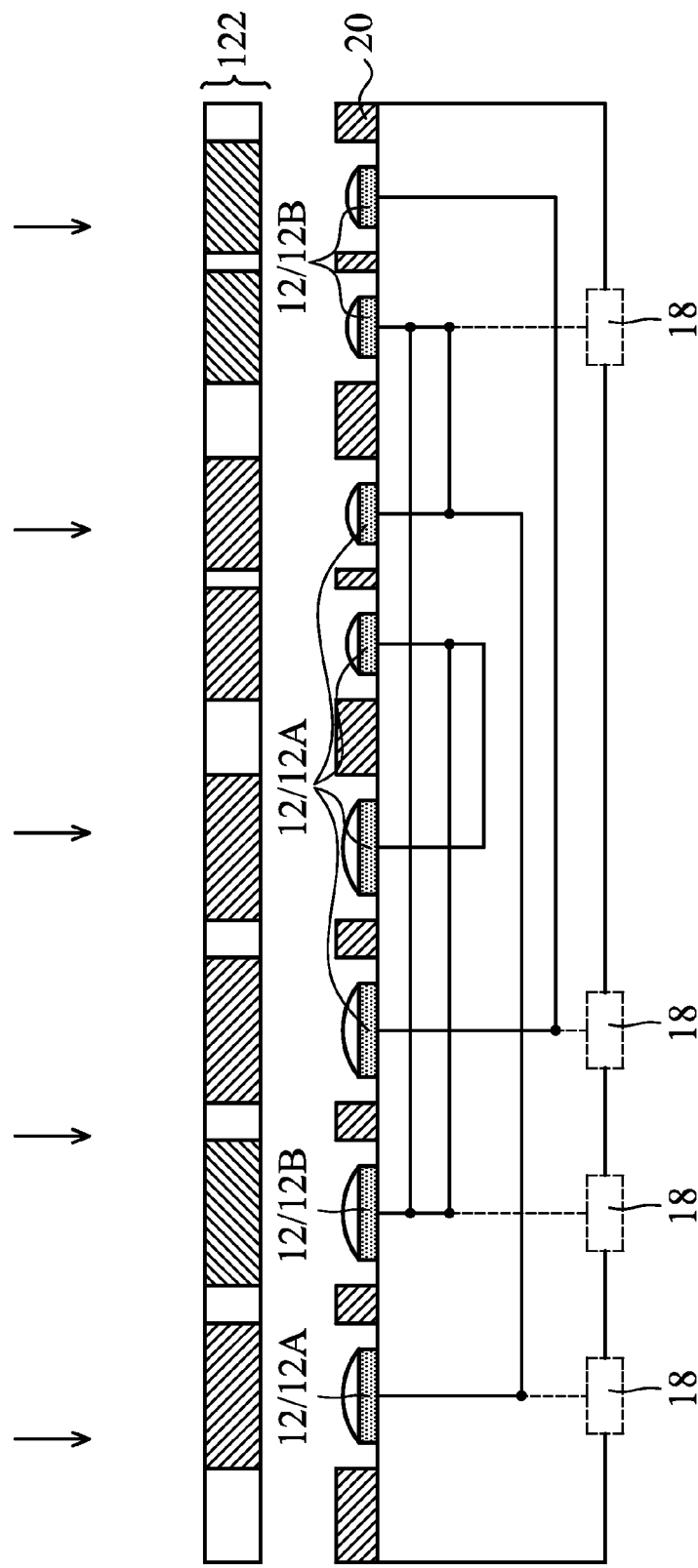
Figure 6:
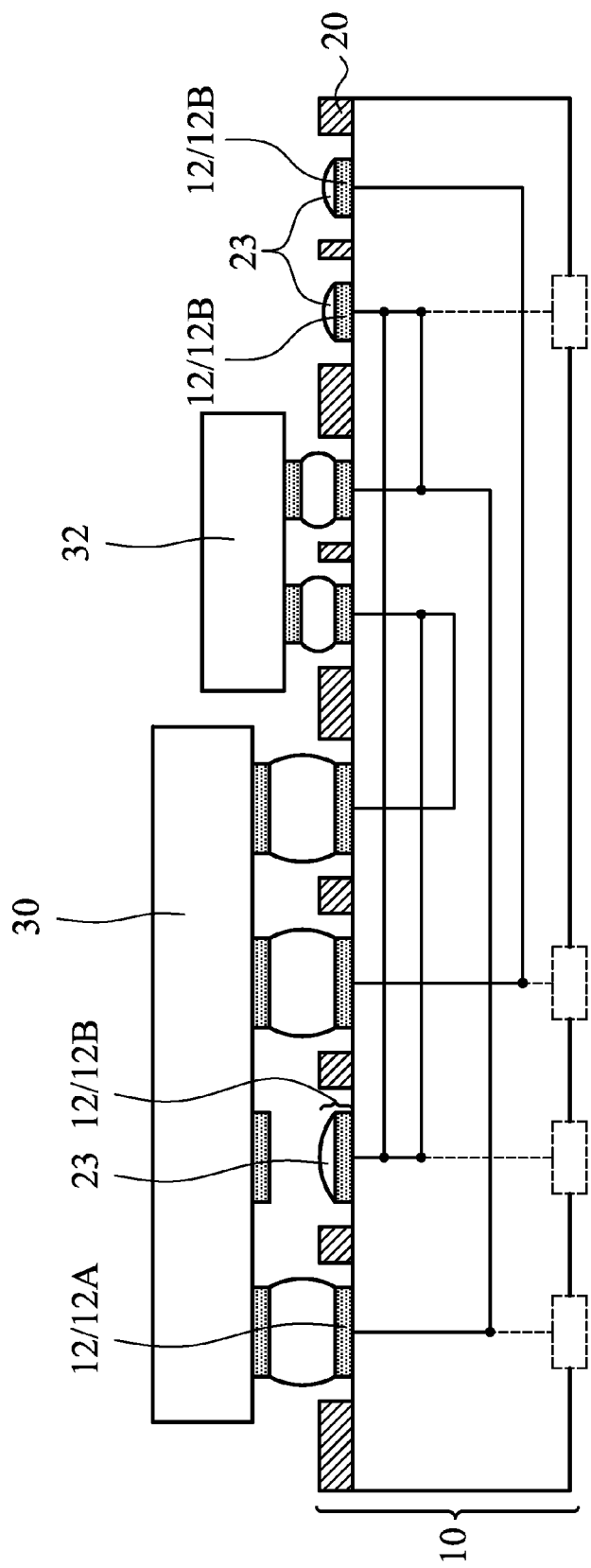
Figure 7:
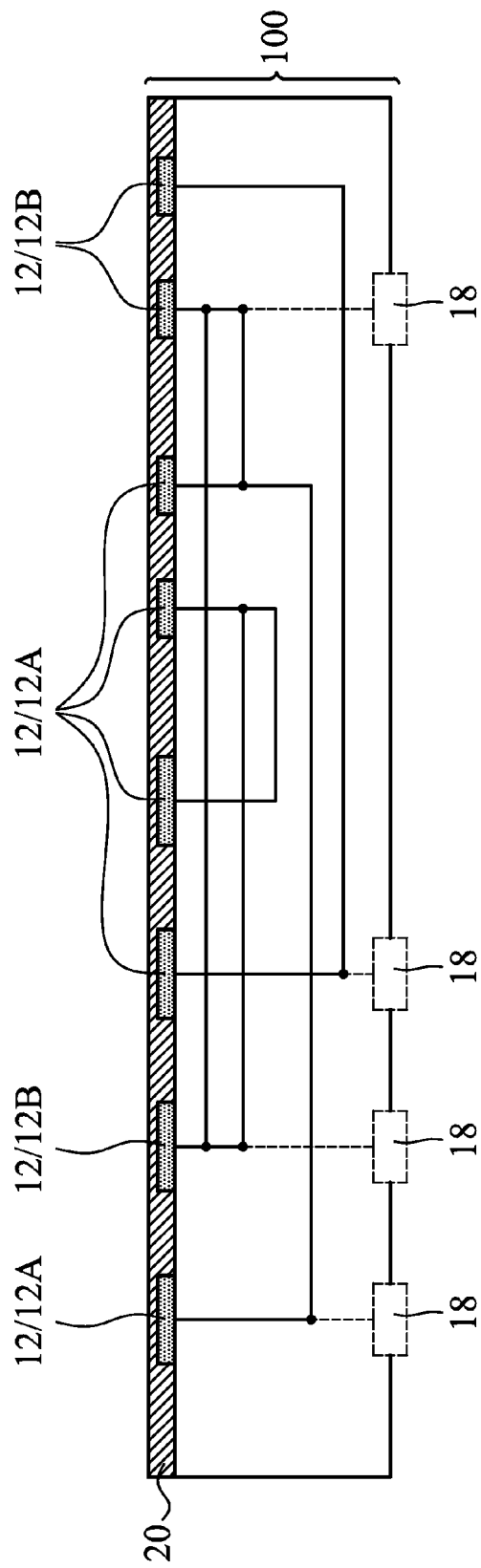
FIGS. 7 through 9 are cross-sectional views of intermediate stages in the manufacturing of a second-generation package in accordance with some exemplary embodiments.
Figure 8:
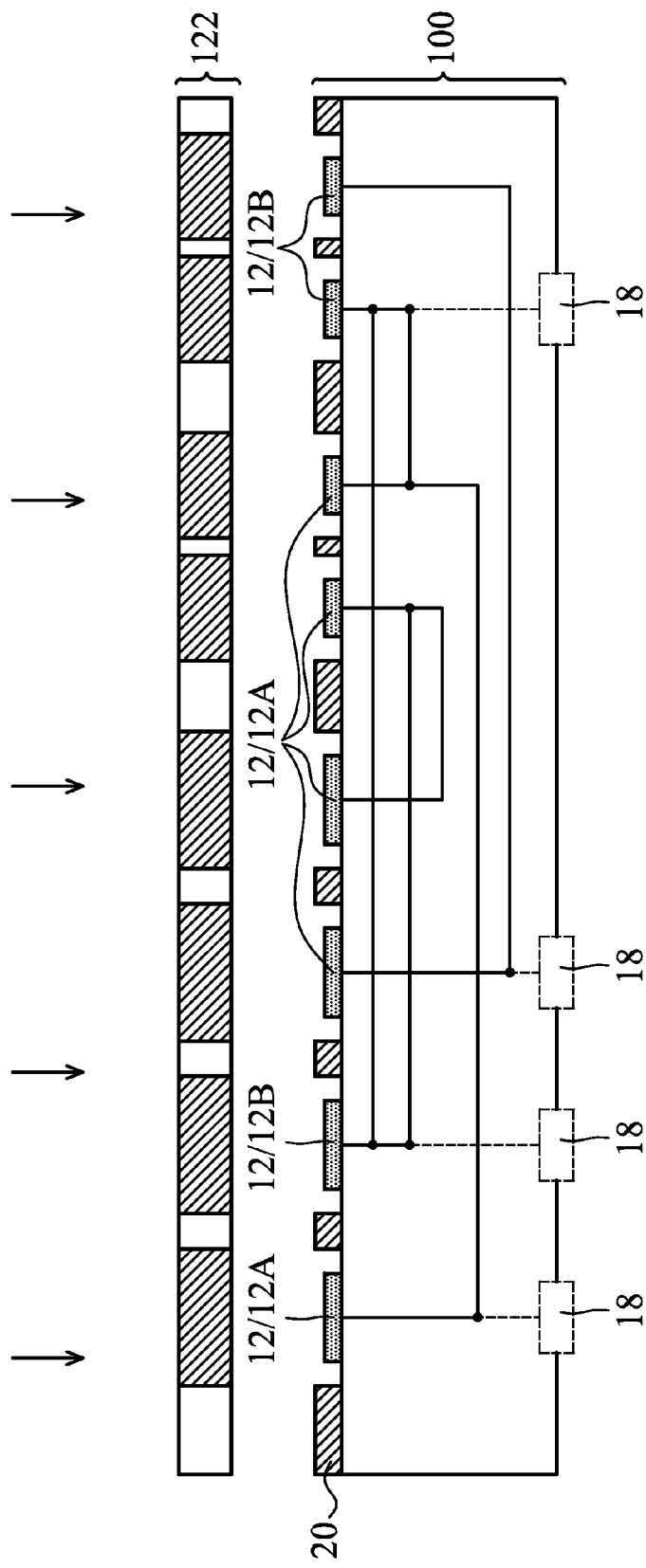
Figure 9:
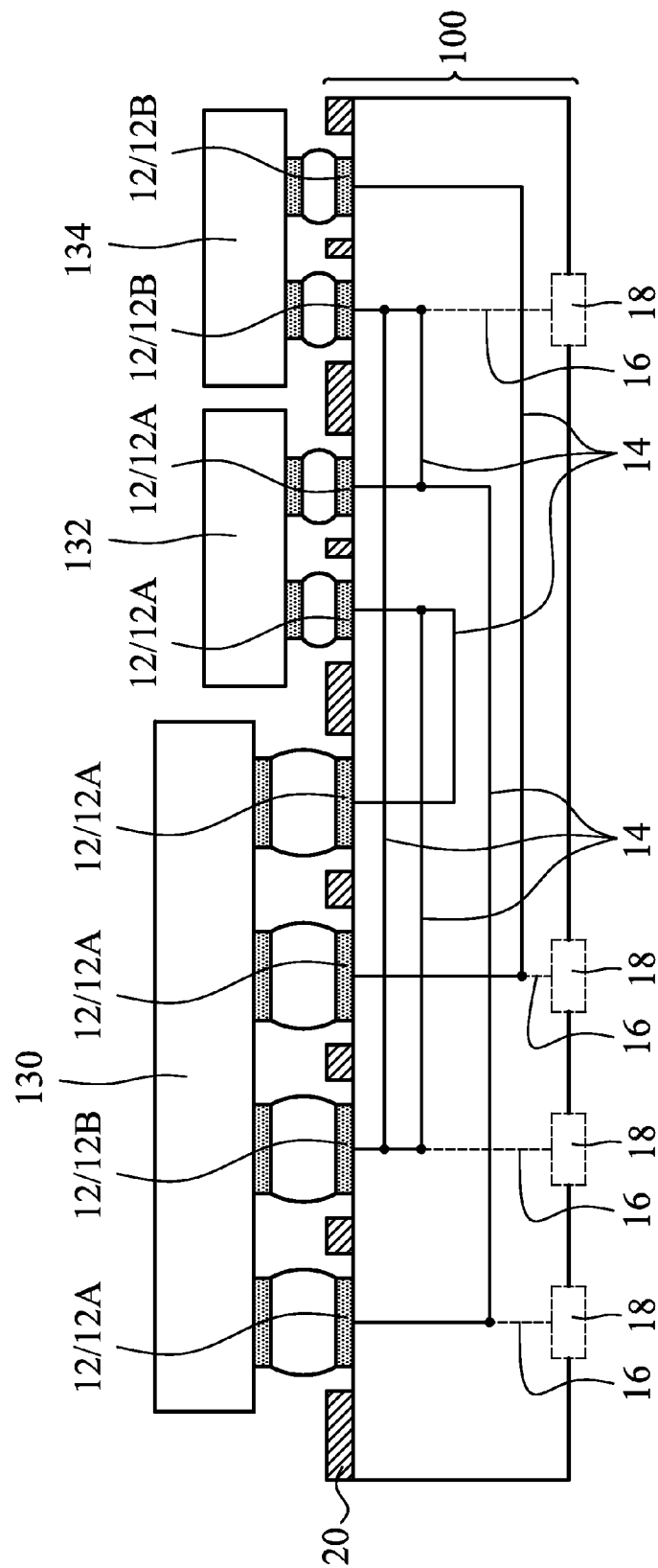

FIGS. 1 through 6 illustrates the formation of package component 10 and the packaging using package component 10. The respective packages in FIGS. 3 and 6 are referred to as first-generation packages hereinafter. FIGS. 7 through 9 illustrate the formation of package component 100, which has an identical structure as the package component 10 in FIG. 1, and the packaging using package component 100. The respective package in FIG. 9 is referred to as a second-generation package hereinafter. The first-generation package and the second-generation package may have similar functions and similar structures. For example, the package component 130 in FIG. 9 may be identical to package component 30 in FIGS. 3 and 6. The package component 30 in FIGS. 3 and 6 and the package component 130 in FIG. 9 may also have most of circuits same as each other, while a small portion of the circuits, for example, less than 10 percent, or less than 5 percent, of the circuits in package components 30 and 130 are different from each other. In some embodiments, the package in FIG. 9 is an evolved version of the packages in FIGS. 3 and 6.

Referring to FIG. 1, package component 10 is formed. In some embodiments, package component 10 is an interposer. In alternative embodiments, package component 10 is a package substrate such as a laminate substrate or a build-up substrate. In yet other embodiments, package component 10 is a Printed Circuit Board (PCB). Package component 10 includes electrical connectors 12 (which further include 12A and 12B) on the top surface 10A, wherein electrical connectors 12 may comprise bond pads, solder bumps, composite electrical connectors including metal pillars covered with solder caps, or the like. Electrical connections 14 are built in package component 10, and may interconnect electrical connectors 12. Electrical connectors 12A and 12B may, or may not, be identical to each other. In some embodiments wherein package component 10 comprises an interposer or a package substrate, electrical connections 16 are also disposed in package component 10, and used for electrically coupling electrical connectors 12 to electrical connectors 18 at bottom surface 10B of package component 10, wherein surfaces 10A and 10B are opposite surfaces of package component 10. In alternative embodiments, for example, when package component 10 is a PCB, no electrical connection is formed to connect to bottom surface 10B of package component 10.

In some embodiments, dielectric layer 20 is formed to cover electrical connectors 12 in order to insulate electrical connectors 12 from external detrimental substances such as moisture. Dielectric layer 20 may be a top layer of package component 10, or may be an added layer on top of package component 10. Accordingly, dielectric layer 20 may be, or may not be, considered as a portion of package component 10. Dielectric layer 20 may be a solder mask, and hence is referred to as solder mask 20 throughout the description, although other dielectric materials having adequate insulation ability may also be used.

Referring to FIG. 2, a patterning step is performed to remove some portions of solder mask 20, so that the underlying electrical connectors 12A are exposed. Electrical connectors 12B remain covered by solder mask 20. The patterning may be performed through an etching step, wherein lithography mask 22 is used for defining the pattern of solder mask 20, for example, through the exposure of a photo resist (not shown) that is used for etching solder mask 20. Lithography mask 22 includes opaque patterns 24 for blocking light and transparent patterns 26 for allowing the light to pass through. Although FIG. 2 illustrates that the edges of solder mask 20 are spaced apart from electrical connectors 12A, solder mask 20 also covers the edge portions of electrical connectors 12A in alternative embodiments.

Referring to FIG. 3, package component 30 and/or package component 32 are bonded to electrical connectors 12A. Each of package components 30 and 32 may be a device die including active devices such as transistors therein, or may be a package. Each of package components 30 and 32 may also be a stand-alone passive device such as an inductor, a transformer, a balun, or the like. Electrical connectors 12B are not bonded to any overlying package components. Electrical connectors 12B may include electrical connectors 12B1, which is overlapped by package component 30. Electrical connectors 12B further include electrical connectors 12B2, which are not overlapped by any package components. Electrical connectors 12B2 are also misaligned with package components 30 and 32. The bonding of package components 30 and 32 may be performed through solder bonding, direct metal-to-metal bonding, or the like.

As shown in FIG. 3, electrical connectors 12B, although not bonded, may still be electrically coupled to electrical connectors 12A, which are bonded to overlying package components 30 and/or 32, and/or electrically coupled to electrical connectors 18B, which is on the bottom side of package component 10. Accordingly, although electrical connectors 12B are not bonded, electrical connectors 12B may, or may not, be electrically floating. Throughout the description, in the packages, electrical connectors 12B that is not bonded to other package components are referred to as dummy connectors.

FIGS. 4 through 6 illustrate cross-sectional views of intermediate stages in the formation of a package in accordance with alternative embodiments. Unless specified otherwise, the materials and formation methods of the components in these embodiments are essentially the same as the like components, which are denoted by like reference numerals in the embodiments shown in FIGS. 1 through 3. The details of the like components shown in FIGS. 4 through 6 may thus be found in the discussion of the embodiment shown in FIGS. 1 through 3. Referring to FIG. 4, package component 10 is formed. Package component 10 is essentially the same as the package component 10 shown in FIG. 1, except that pre-solder layers 23 are formed as a top portion of each of electrical connectors 12. Next, as shown in FIG. 5, solder mask 20 is patterned, and electrical connectors 12A and 12B are exposed. Lithography mask 122 that is used for the patterning step is thus different from the lithography mask 22 in FIG. 2.

In the following steps, as shown in FIG. 6, package components 30 and/or 32 are bonded to electrical connectors 12A, while electrical connectors 12B are not bonded to any overlying package components. Solder layers 23 may be exposed after the bonding process, and act as the protection of the underlying metal features. In alternative embodiments, when pre-solder layers 23 are formed, solder mask 20 may be omitted. The resulting structure is essentially the same as shown in FIG. 6, except that there is no solder mask 20.

FIGS. 7 through 9 illustrate the formation of the second-generation package, wherein the design of package component 10 is reused. Referring to FIG. 7, package component 100 is formed. Package component 100 may be identical to the package component 10 in FIG. 1. Particularly, the portions of package component 10 not including solder mask 20 are identical to the portions of package component 100 not including solder mask 20. Solder mask 20 in FIG. 1 may be identical to, or may be different from solder mask 20 in FIG. 7.

Next, as shown in FIG. 8, a patterning step is performed to remove some portions of solder mask 20, so that the underlying electrical connectors 12A are exposed. The patterning may be performed through an etching step, wherein lithography mask 122 is used for defining the pattern of solder mask 20, for example, through the exposure of a photo resist (not shown), with the photo resist used as the etch mask for etching solder mask 20. Lithography mask 122 is different from lithography mask 22 in FIG. 2. Accordingly, in addition to the electrical connectors 12A, at least one of electrical connectors 12B is exposed. In some embodiments, one or more of electrical connectors 12B are exposed, and one or more of electrical connectors 12B remain covered by solder mask 20. In alternative embodiments, all of electrical connectors 12A and 12B are exposed.

FIG. 9 illustrates the bonding of package components 130, 132 and/or 134 to package component 100. Each of package components 130, 132, and 134 may be a device die including active devices such as transistors therein, a package, a stand-alone passive device, or the like. In some exemplary embodiments, package component 130 in FIG. 9 and package component 30 in FIG. 3 or FIG. 6 are identical to each other. In alternative embodiments, package components 130 and package component 30 in FIG. 3 or FIG. 6 are similar to, and not identical to, each other. For example, package components 130 and package component 30 may have over 90 percent circuit identical to each other, while the remaining circuits are different from each other. At least one electrical connector 12B is bonded with an overlying package component (such as 130 and 134, as illustrated). In some embodiments, all of electrical connectors 12B are bonded with overlying package components. In alternative embodiments (not shown), some of electrical connectors 12B remain not bonded, and may be bonded in a third-generation package (not shown). The un-bonded electrical connectors 12B may be exposed, or may be covered by solder mask 20.

Figure 10:
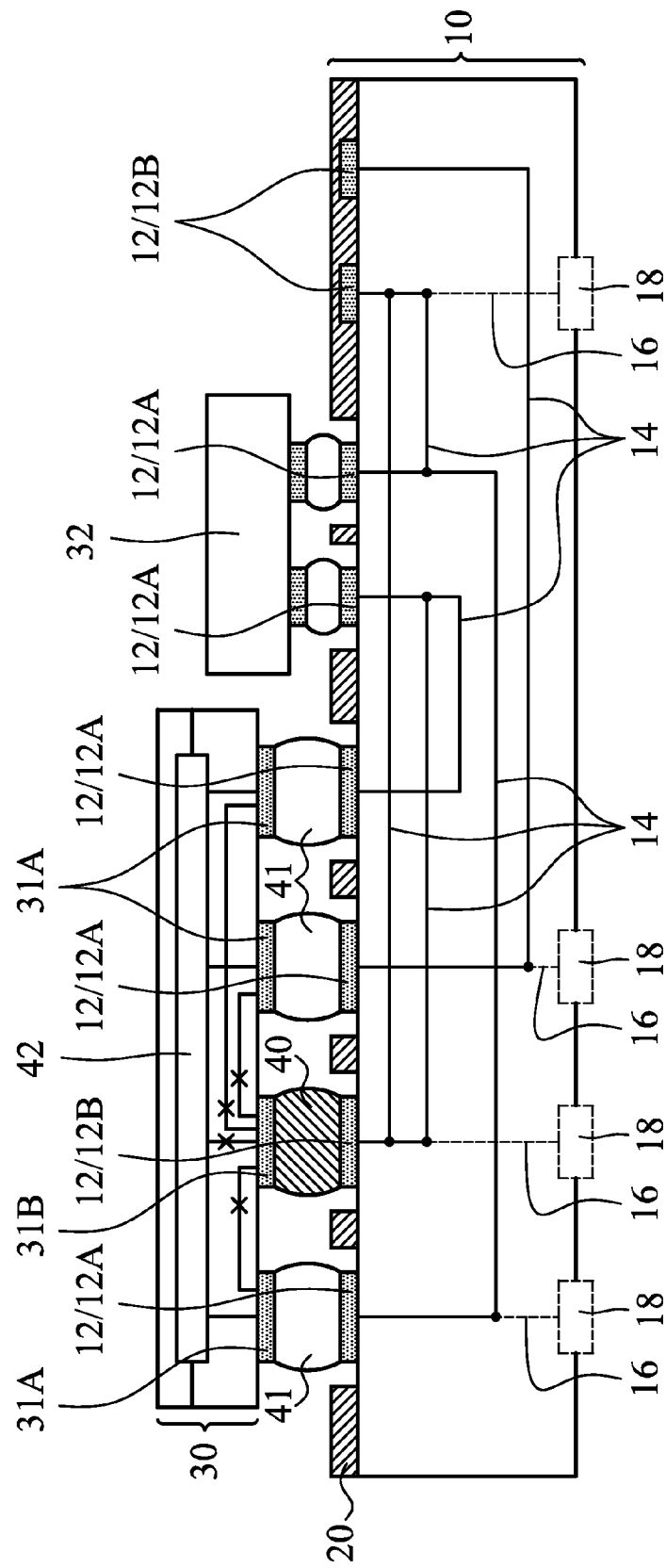
FIG. 10 illustrates a first-generation package comprising a dummy bond.

FIG. 10 illustrates a package formed in accordance with alternative embodiments. In these embodiments, electrical connectors 12A are bonded to the overlying package components 30 and 32 through active bonds 41, which may be solder bonds, for example. Active bonds 41 are configured to pass voltages and/or currents between the bonded package components. Dummy bond 40 is also made, for example, through dummy solder bump 40. The respective underlying electrical connector 12B is thus also referred to as a dummy connector. The dummy bond 40 bonds electrical connector 12B to overlying package component 30. Dummy bond 40 may be electrically coupled to other portions of the resulting package through the electrical connections 14/16 in package component 10. Accordingly, during the operation of the resulting package, dummy bond 40 may be applied with voltages/signals. Dummy bond 40, however, as indicated by the "x" signs, is not electrically coupled to functional circuit 42, which may include transistors, for example, and other active bond pads 31A of package component 30 that are bonded to electrical connectors 12A. Accordingly, no current flows through dummy bond 40. Furthermore, package component 30 includes electrical connector 31B, which is a dummy electrical connector that is electrically floating when package component 30 is not bonded to package component 10. In these embodiments, dummy electrical connector(s) may provide mechanical support, and share the stress in the package, although they do not have electrical functions.

In the embodiments, by adopting the identical design for package components 10 (FIGS. 1 and 4) and 100 (FIG. 7), the cost for designing and manufacturing package component 100 is reduced. Since the packages in FIG. 9 may be the later generation of the packages in FIGS. 3 and 6, at the time the first-generation package is designed, additional electrical connectors 12B and the respective electrical connections may be reserved for the second-generation packages. At the time the second-generation packages are formed, a simple modification may be made to modify the lithography mask 122 in FIG. 8, and the cost related to the design of package component 100 (FIG. 9), the design and the manufacturing of the lithography masks that are used for manufacturing package component 100, and the like, is saved.

In accordance with embodiments, a device includes a first package component, and a second package component underlying the first package component. The second package component includes a first electrical connector at a top surface of the second package component, wherein the first electrical connector is bonded to the first package component. The second package component further includes a second electrical connector at the top surface of the second package component, wherein no package component is overlying and bonded to the second electrical connector.

In accordance with other embodiments, a device includes a first package component and a second package component. The second package component includes a first electrical connector at a top surface of the second package component, wherein the first electrical connector is bonded to the first package component through an active bond. The second package component further includes a second electrical connector at the top surface of the second package component. The second electrical connector is bonded to the first package component through a dummy bond. A third electrical connector is at the top surface or a bottom surface of the second package component, wherein the second electrical connector is electrically coupled to the third electrical connector.

In accordance with yet other embodiments, a method includes bonding a first package component with a second package component, and bonding a third package component with a fourth package component. The second and the fourth package components are substantially identical to each other. Each of the second and the fourth package components includes a first electrical connector at a top surface of a respective one of the second and the fourth package components, wherein the first electrical connector of the second package component is bonded to the first package component, and the first electrical connector of the fourth package component is bonded to the third package component. Each of the second and the fourth package components further includes a second electrical connector at the top surface of the respective one of the second and the fourth package components, wherein no package component is overlying and bonded to the second electrical connector of the second package component, and wherein the second electrical connector of the fourth package component is bonded to an overlying package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A system comprising:
    a first package component;
    a second package component, wherein each of the first and the second package components comprises:
        a first electrical connector and a second electrical connector, wherein a first relative position of the first electrical connector in the first package component is identical to a second relative position of the first electrical connector in the second package component, and a third relative position of the second electrical connector in the first package component is identical to a fourth relative position of the second electrical connector in the second package component;
    a first surface dielectric layer over the first package component, wherein the first electrical connector of the first package component is exposed through an opening in the first surface dielectric layer, and the second electrical connector of the first package component is covered by the first surface dielectric layer; and
    a second surface dielectric layer over the second package component, wherein the first surface dielectric layer and the second surface dielectric layer are formed of a same dielectric material, and both the first electrical connector and the second electrical connector of the second package component are exposed through the second surface dielectric layer.

2. The system of claim 1, wherein the first package component and the second package component are identical to each other.

3. The system of claim 1 further comprising:
    a third package component bonded to the first package component through the first electrical connector of the first package component; and
    a fourth package component bonded to the second package component through the first electrical connector of the second package component.

4. The system of claim 3, wherein the third package component is identical to the fourth package component.

5. The system of claim 3, wherein the third package component and the fourth package component include a first circuit same in the third package component and the fourth package component, and wherein a first one of the third package component and the fourth package component comprises a circuit not in a second one of the third package component and the fourth package component.

6. The system of claim 3, wherein both the first electrical connector and the second electrical connector of the first package component are overlapped by the third package component.

7. The system of claim 3, wherein the fourth package component is bonded to the second package component further through the second electrical connector of the second package component.

8. The system of claim 3 further comprising a fifth package component bonded to the second package component through the second electrical connector of the second package component.

9. The system of claim 1 further comprising a solder region in contact with the first electrical connector of the first package component, and additional solder regions in contact with the first electrical connector and the second electrical connector of the second package component.

10. A system comprising:
a first package component;
a second package component, wherein each of the first and the second package components comprises:
- a first metal pad and a second metal pad, wherein a first relative position of the first metal pad in the first package component is identical to a second relative position of the first metal pad in the second package component, and a third relative position of the second metal pad in the first package component is identical to a fourth relative position of the second metal pad in the second package component;
- a first solder region and a second solder region over and in contact with the first metal pad and the second metal pad, respectively;

a third package component bonded to the first package component, wherein the first metal pad and the first solder region of the first package component are bonded to an additional metal pad of the third package component, and wherein the second metal pad of the first package component is not bonded to the third package component; and a fourth package component bonded to the second package component, wherein the first and the second metal pads and the first and the second solder regions of the second package component are bonded to additional metal pads of the fourth package component.

11. The system of claim 10, wherein the second package component is identical to the first package component, and wherein the device further comprises:
- a first surface dielectric layer over and contacting a top surface of the first package component, wherein a top surface of the second solder region of the first package component is in physical contact with a bottom surface of the first surface dielectric layer; and
- a second surface dielectric layer over and contacting a top surface of the second package component.

12. The system of claim 11, wherein the first surface dielectric layer and the second surface dielectric layer are formed of a same dielectric material.

13. The system of claim 10, wherein the third package component and the fourth package component overlap the second metal pads of the first package component and the second package component, respectively.

14. The system of claim 10, wherein the fourth package component is a newer generation of the third package component.

15. The system of claim 10, wherein the third package component is identical to the fourth package component.

16. The system of claim 10, wherein the third package component and the fourth package component comprise first circuits same as each other, and second circuits different from each other.

17. A system comprising:
a first package component;
a second package component, wherein each of the first package component and the second package component comprises:
- a surface dielectric layer, wherein first openings in the surface dielectric layer of the first package component have a first layout different from a second layout of second openings in the surface dielectric layer of the second package component; and
- remaining portions other than the surface dielectric layer, wherein the remaining portions of the first package component are identical to the remaining portions of the second package component; and a third package component and a fourth package component bonded to the first package component and the second package component, respectively.

18. The system of claim 17, wherein each of the first package component and the second package component comprises a first electrical connector and a second electrical connector, wherein the third package component is bonded to the first package component through the first electrical connector of the first package component, and not through the second electrical connector of the first package component, and the fourth package component is bonded to the second package component through both the first electrical connector and the second electrical connector of the second package component.

19. The system of claim 18, wherein the second electrical connector of the first package component is covered by the surface dielectric layer of the first package component.

20. The system of claim 17, wherein the third package component is identical to the fourth package component.

* * * * *